(12) United States Patent
Darwish et al.

(10) Patent No.: US 10,079,420 B2
(45) Date of Patent: Sep. 18, 2018

(54) BROADBAND HIGH POWER MICROWAVE COMBINER/DIVIDER

(71) Applicant: U.S. Army Research Laboratory ATTN: RDRL-LOC-I, Adelphi, MD (US)

(72) Inventors: Ali M. Darwish, Laurel, MD (US); Hingloi Alfred Hung, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 52 days.

(21) Appl. No.: 15/428,623

(22) Filed: Feb. 9, 2017

(65) Prior Publication Data

US 2017/0346151 A1    Nov. 30, 2017

Related U.S. Application Data

(60) Provisional application No. 62/340,919, filed on May 24, 2016.

(51) Int. Cl.
| | | |
|---|---|---|
| *H01P 5/12* | (2006.01) | |
| *H01P 5/16* | (2006.01) | |
| *H03H 7/00* | (2006.01) | |

(52) U.S. Cl.
CPC .............. *H01P 5/16* (2013.01); *H03H 7/00* (2013.01)

(58) Field of Classification Search
CPC ........................................................ H03H 7/00
USPC ................................................. 333/129–132
See application file for complete search history.

(56) References Cited

PUBLICATIONS

Ali Darwish, Kenneth McKnight, Mona Zaghloul, Edward Viveiros, and H. Alfred Hung, "Simple Broadband Gysel Combiner with a Single Coupled Line" presented at the International Microwave Symposium IM52016, May 22-27, 2016 San Francisco, California (paper presented May 24 (14:50-15:00) at session TU3A-6: Simple Broadband Gysel Combiner with a Single Coupled Line).
IMS2016 Technical Sessions Agenda. [accessed May 19, 2016].
IMS Insider—Issue 6, distributed via email to members on Tue, May 17, 2016.

*Primary Examiner* — Robert J Pascal
*Assistant Examiner* — Kimberly Glenn
(74) *Attorney, Agent, or Firm* — Eric Brett Compton

(57) ABSTRACT

A power combiner and divider device includes a first port electrically connected to a first impedance line and a second impedance line; a second port electrically connected to the first impedance line and a coupled line; a third port electrically connected to the second impedance line and the coupled line; a third impedance line electrically connected to the coupled line; and a fourth impedance line electrically connected to each of the third impedance line and the coupled line.

20 Claims, 12 Drawing Sheets

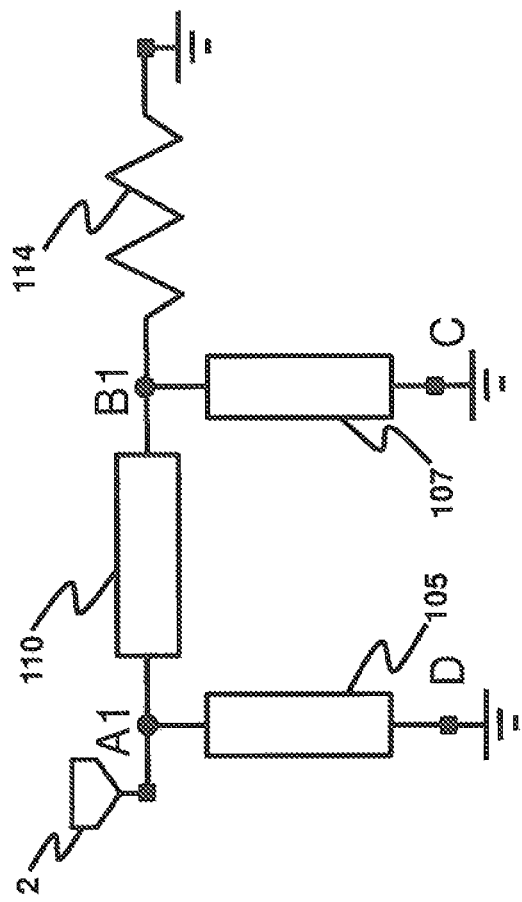

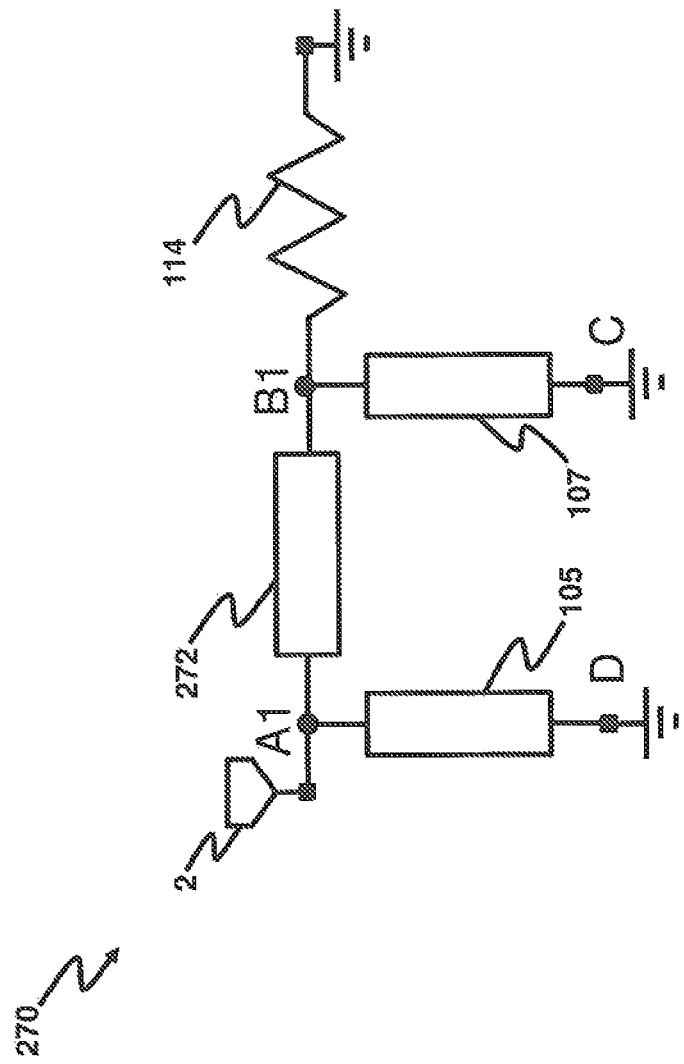

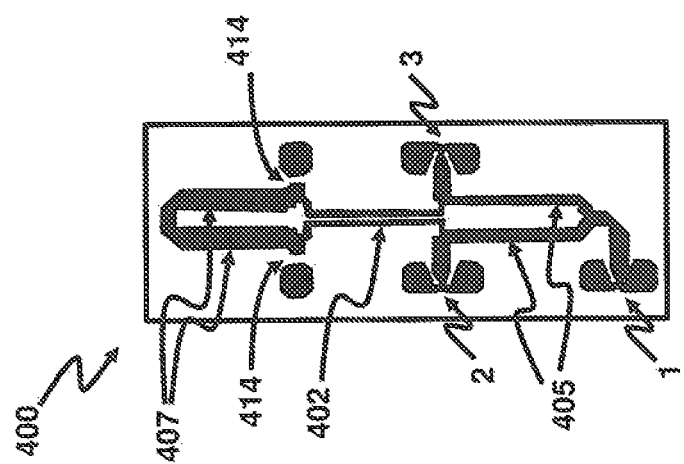

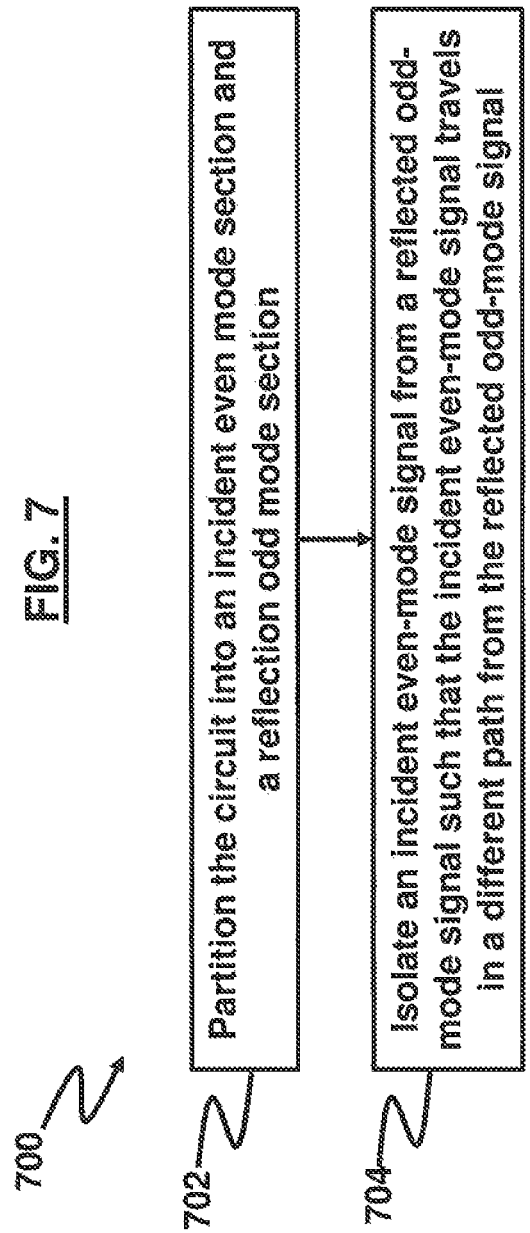

BROADBAND HIGH POWER MICROWAVE COMBINER/DIVIDER

CROSS REFERENCE TO RELATED APPLICATION

This application claims the benefit of U.S. Provisional Patent Application No. 62/340,919 filed on May 24, 2016, the contents of which, in its entirety, is herein incorporated by reference.

GOVERNMENT INTEREST

The embodiments herein may be manufactured, used, and/or licensed by or for the United States Government without the payment of royalties thereon.

BACKGROUND

Technical Field

The embodiments herein generally relate to electrical circuits, and more particularly to microwave combiner/divider circuits.

Description of the Related Art

Radar systems include multiple high frequency electronic modules and circuits. A combiner/divider circuit is an important component of a radar system that allows for managing the distribution of the electronic signal power throughout the system. An electronic power divider may be made of multiple coupling circuits, which when operated in a reverse direction can function as a power combiner. It is desirable to design and implement combiner/divider circuits that can operate in broadband system and can handle high power signals.

The Wilkinson divider is a commonly used power divider. However, a main limitation of the Wilkinson divider stems from its isolation resistor that poses two problems. First, it is assumed to have zero or very small electrical delay. Second, it joins two signal branches of the divider and does not connect to ground. Moreover, the requirement of having a very small electrical length is difficult to satisfy, especially, for discrete resistors (such as surface mount resistors). Even for Monolithic Microwave Integrated Circuits (MMICs), satisfying this requirement means the two signal branches have to be brought into close proximity with each other (which introduces coupling) and using a resistor with small physical dimensions. However, reducing the resistor's physical dimension reduces its power handling capability. Additionally, the fact that it is not grounded makes it difficult to dissipate the heat.

The Gysel combiner/divider may solve both problems and can be used for combing high power signals. It may further provide improvements, such as operating the Gysel combiner/divider with equal/unequal power division and arbitrary terminal impedances. Additionally, a dual-frequency operation of the combiner/divider may be provided. Coupled lines may also be used with Gysel dividers, to introduce signal filtering or dual band operation. The use of coupled lines may lead to greater losses in the divider and complicate the design process as the circuit acquires more poles and zeros.

SUMMARY

In view of the foregoing, an embodiment herein provides a power combiner and divider device, the device comprising a first port electrically connected to a first impedance line and a second impedance line; a second port electrically connected to the first impedance line and a coupled line; a third port electrically connected to the second impedance line and the coupled line; a third impedance line electrically connected to the coupled line; and a fourth impedance line electrically connected to each of the third impedance line and the coupled line.

The third impedance line may be electrically connected to a first resistor at a first connection point where the third impedance line is electrically connected to the coupled line, and wherein the first resistor may be electrically connected to ground. The fourth impedance line may be electrically connected to a second resistor at a second connection point where the fourth impedance line is electrically connected to the coupled line, and wherein the second resistor may be electrically connected to ground. The first resistor may be approximately 50 ohms and the second resistor is approximately 50 ohms.

An even mode equivalent impedance from the second port and the third port may be adjusted independent from an odd mode equivalent impedance from the second port and the third port by adjusting a coupling ratio of the coupled line. The even mode equivalent impedance may be greater than the odd mode equivalent impedance. The first port may be configured to be a first input and the second and third ports may be configured to be a first plurality of outputs when the device is used as a divider, and the second and third ports may be configured to be a second plurality of inputs, and the first port may be configured to be a second output when the device is used as a combiner.

The coupled line may comprise a first microstrip line having a first width; and a second microstrip line having a second width, wherein the first width is approximately equal to the second width, and wherein the first microstrip is in parallel with the second microstrip. The device may be configured to operate in a frequency range from a lower frequency to a higher frequency, wherein the higher frequency is approximately four times higher than the lower frequency.

Another embodiment herein provides a method comprising partitioning a combiner and divider circuit into an incident even mode section and a reflection odd mode section; and isolating an incident even-mode signal from a reflected odd-mode signal such that the incident even-mode signal travels in a different path from the reflected odd-mode signal, wherein the reflected signal is generated by an impedance mismatch of an electronic joint in the circuit, wherein the circuit is configured to operate in a frequency range from a lower frequency to a higher frequency, wherein the higher frequency is approximately four times higher than the lower frequency.

The method may further comprise electrically connecting a first port to a first impedance line and a second impedance line; electrically connecting a second port to the first impedance line and a coupled line; electrically connecting a third port to the second impedance line and the coupled line; electrically connecting a third impedance line to the coupled line; electrically connecting a fourth impedance line to each of the third impedance line and the coupled line.

The method may further comprise electrically connecting the third impedance line to a first resistor at a first connection point where the third impedance line is electrically connected to the coupled line; and electrically connecting the first resistor to ground. The method may further comprise electrically connecting the fourth impedance line to a second resistor at a second connection point where the fourth impedance line is electrically connected to the coupled line; and electrically connecting the second resistor to ground.

The first resistor may be approximately 50 ohms and the second resistor may be approximately 50 ohms. The method may further comprise adjusting a coupling ratio of the coupled line to adjust an even mode equivalent impedance from the second port and the third port independently from an odd mode equivalent impedance from the second port and the third port. The method may further comprise adjusting the even mode equivalent impedance to be greater than odd mode equivalent impedance. The method may further comprise adjusting the odd mode equivalent impedance to be approximately 50 ohms.

Another embodiment herein provides a power combiner and divider device, the device comprising a first port electrically connected to a first impedance line and a second impedance line; a second port electrically connected to the first impedance line and a coupled line; a third port electrically connected to the second impedance line and the coupled line; a third impedance line electrically connected to the coupled line; and a fourth impedance line electrically connected to each of the third impedance line and the coupled line, wherein the third impedance line is electrically connected to a first resistor at a first connection point where the third impedance line is electrically connected to the coupled line, and the first resistor is electrically connected to ground, and wherein the fourth impedance line is electrically connected to a second resistor at a second connection point where the fourth impedance line is electrically connected to the coupled line, and the second resistor is electrically connected to ground.

The first resistor may be approximately 50 ohms and the second resistor is approximately 50 ohms, and wherein an even mode equivalent impedance from the second port and the third port may be adjusted independent from an odd mode equivalent impedance from the second port and the third port by adjusting a coupling ratio of the coupled line. The even mode equivalent impedance may be greater than odd mode equivalent impedance, and wherein the odd mode equivalent impedance may be approximately 50 ohms.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1C illustrates a schematic diagram of an odd mode equivalent circuit of the known Gysel combiner/divider circuit;

FIG. 2C illustrates a schematic diagram of an odd mode equivalent circuit of the combiner/divider according to an embodiment herein;

FIG. 4 illustrates a layout diagram of a combiner/divider covering 2.5-8 GHz according to an embodiment herein;

FIG. 7 is a flow diagram illustrating a method according to an embodiment herein.

DETAILED DESCRIPTION

Figure 1A:
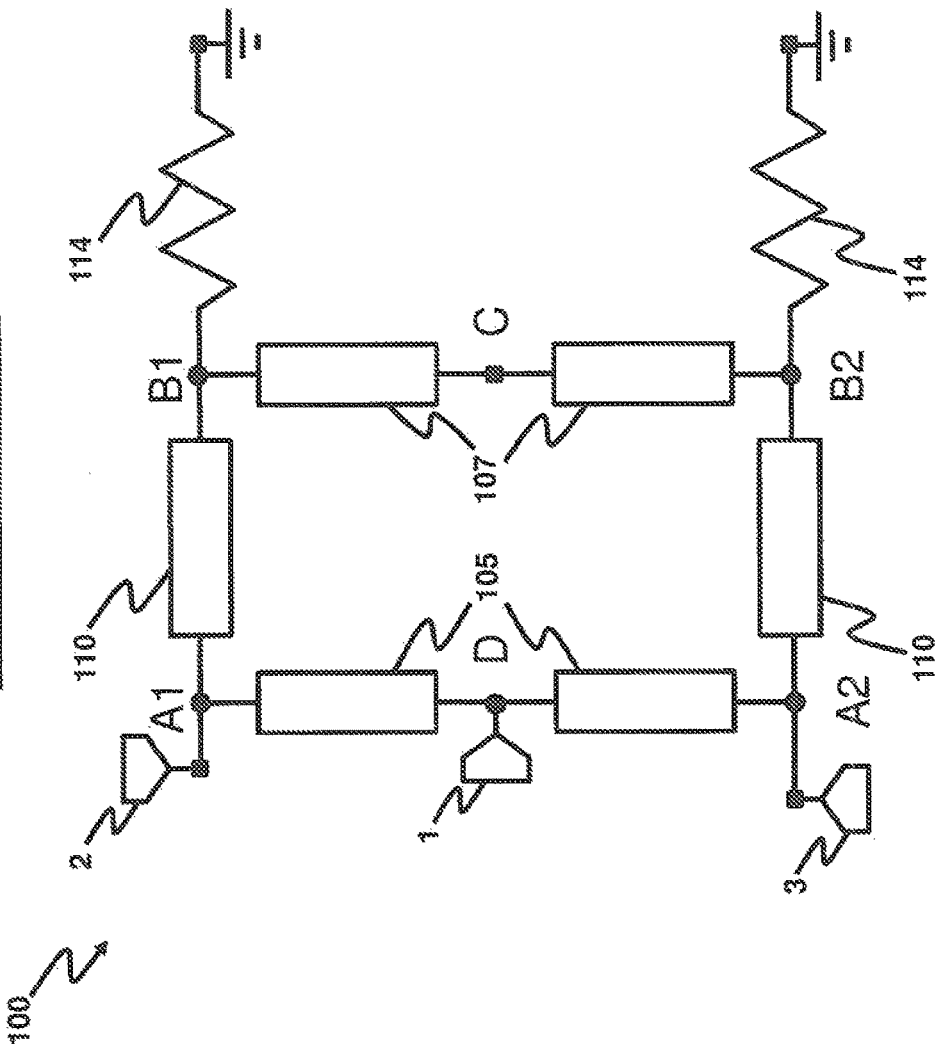
FIG. 1A illustrates a schematic diagram of a known Gysel combiner/divider circuit.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

A goal for next generation radar and electronic warfare systems is to consolidate multiple, single-frequency units into an affordable, flexible, modular, single system. An embodiment herein provides a broadband, high power combiner/divider circuit for a single transmitter. The embodiments herein provide a high performance, power combiner/divider circuit that supports the highest broadband frequency (such as 1:4 ratio) operation (e.g., 5-20 GHz, or 10-40 GHz) for high power amplifiers (hundreds of Watts). The embodiments herein provide for partitioning the circuit into an incident even-mode section, and a reflection odd mode section. Hence, incident even-mode signals are isolated from undesirable, reflected signals caused by impedance mismatch from the combined amplifiers. This results in providing efficient power division/combining (low signal loss) over broad frequency band.

It is desirable to maintain the simplicity of the original Gysel structure (with its low loss, due to low impedance, lines) while introducing the minimum number of coupled lines. The embodiments herein may provide a coupled-Gysel, which utilizes a single coupled-line to significantly extend the bandwidth without increasing the insertion loss. Moreover, simulations and measurements are presented according to the embodiments herein for two cases: a 2.5-8 GHz (105% fractional bandwidth) combiner/divider with 0.1 dB loss, and a 3.4-10.2 GHz (100% fractional bandwidth) combiner/divider with 0.2 dB loss. This is one of the largest bandwidth demonstrated for a power combiner/ divider. In the embodiments herein, the high bandwidth is accomplished while maintaining low RF loss and design simplicity.

An embodiment herein provides using a single coupled line segment in the design of a divider/combiner. Significant improvement in bandwidth is realized in the embodiments herein, while maintaining low-loss, ease of design, and flexibility. Referring now to the drawings, where similar reference characters denote corresponding features consistently throughout the figures, there are shown exemplary embodiments.

Figure 1B:
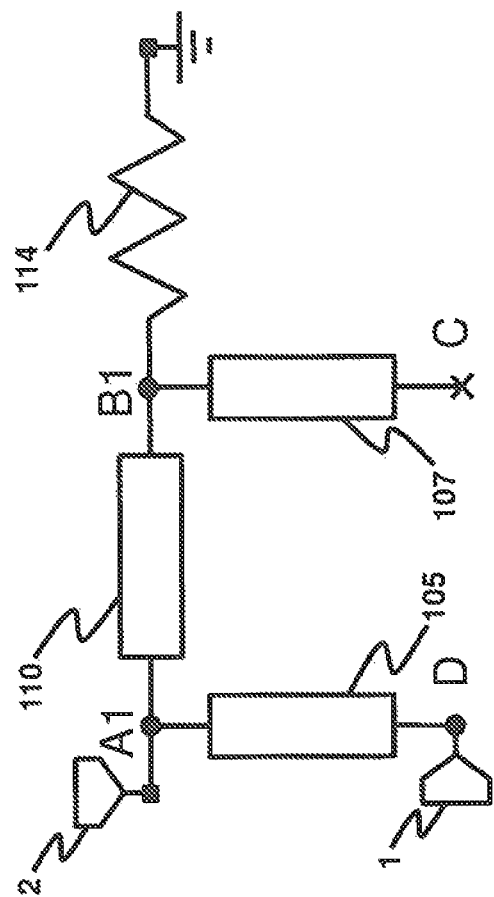
FIG. 1B illustrates a schematic diagram of an even mode equivalent circuit of the known Gysel combiner/divider circuit.

FIGS. 1A through 1C illustrate a known Gysel combiner/divider circuit 100, which is used as a framework circuit in accordance with the embodiments herein. FIG. 1A is a schematic diagram illustrating a Gysel combiner/divider circuit 100. FIG. 1B, with reference to FIG. 1A, is a schematic diagram illustrating the even mode equivalent circuit of the Gysel combiner/divider circuit 100. FIG. 1C, with reference to FIGS. 1A through 1B, is a schematic diagram illustrating the odd mode equivalent of the Gysel combiner/divider circuit 100. The even mode of the circuit 100 refers to the equivalent circuit when it is excited with an in-phase excitation signal. The odd mode of the circuit 100 refers to the equivalent circuit when it is excited with an out-of-phase excitation signal. From port 1, the signal divides equally (due to symmetry) forming an even mode which travels towards ports 2 and 3. Any of the ports 1, 2, and 3 may function as an input port and as an output port. For example, when the circuit 100 is used as a divider, port 1 is an input, and port 2 and port 3 are outputs. When the circuit 100 is used a combiner, port 2 and port 3 are inputs and port 1 is an output.

The λ/4 Z1-fine 105 transforms the impedances of ports 2 and 3 from 50Ω to 100Ω to obtain a good match at port 1. Additionally, the even mode sees a virtual open circuit at C which is transformed by the λ/4 Z3-line 107 into a short circuit at B1 and B2. This, in turn, gets transformed by the λ/4 Z2-lines 110 into an open circuit at A1 and A2. Hence, the even mode, at ports 2 and 3, sees a 50Ω port impedance in parallel with an open circuit and it exits at ports 2 and 3.

On the other hand, the odd mode entering ports 2 and 3 sees a virtual short at D which is transformed into an open circuit by the λ/4 Z1-fine 105. Meanwhile, the odd mode sees a virtual short at C which is transformed into an open circuit by the λ/4 Z3-line 107. As such, the odd mode travels completely through the Z2-line 110 and gets directed towards, and absorbed by the resistors 114. This happens perfectly at the center frequency, $f_o$. The basic idea is that it is desirable for the even mode (entering port 1) to see a high impedance to the right of A1 and A2, and the odd mode to see a low impedance to the right of A1 and A2. This is achieved, in the Gysel combiner/divider circuit 100, through the virtual opens/shorts and the associated λ/4 transformations.

The bandwidth can be improved if the impedances of the odd/even modes can be controlled independently. At the same time, it is desirable to preserve the simplicity of the design and its low loss features.

Figure 2A:
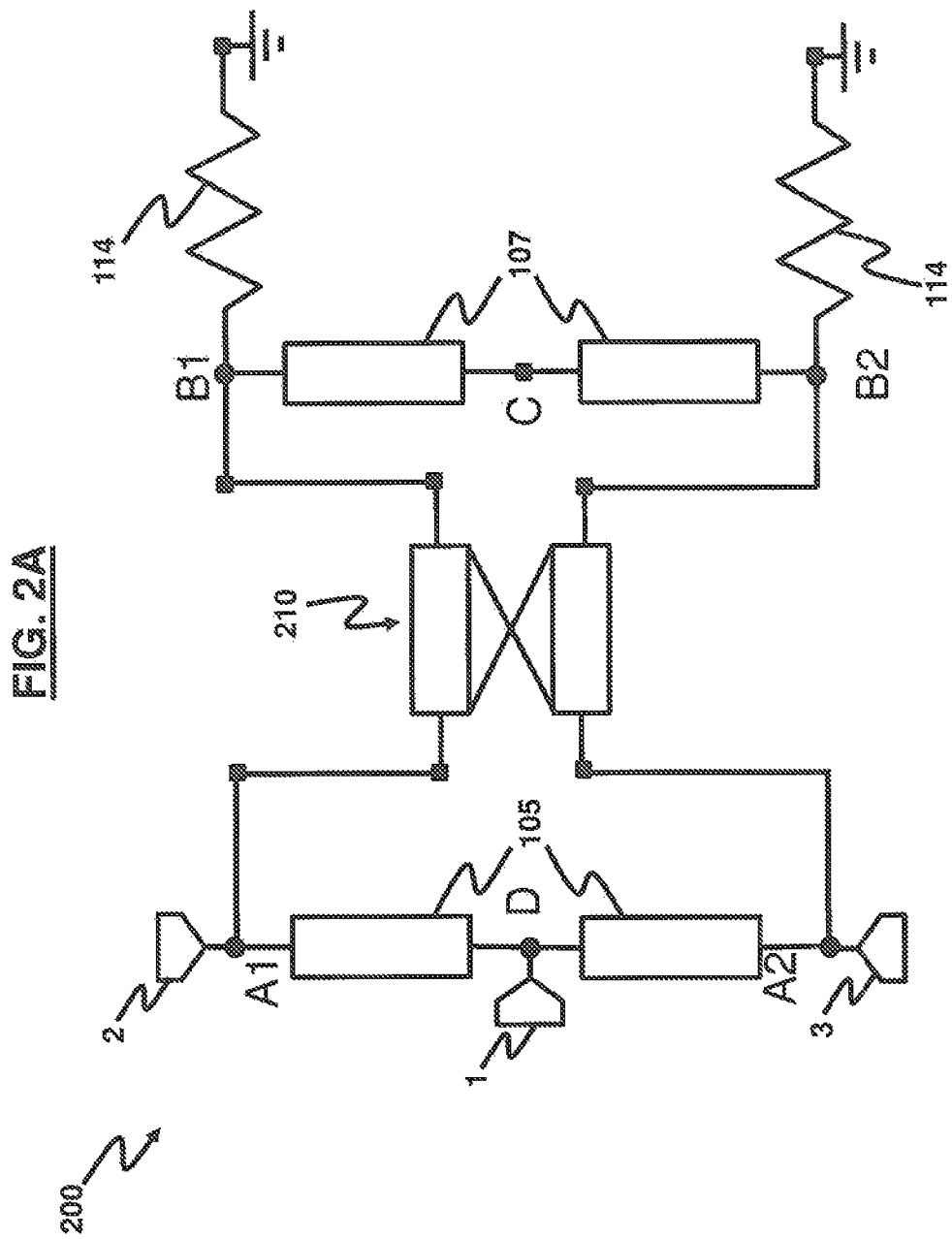
FIG. 2A illustrates a schematic diagram of a combiner/divider according to an embodiment herein.
Figure 2B:
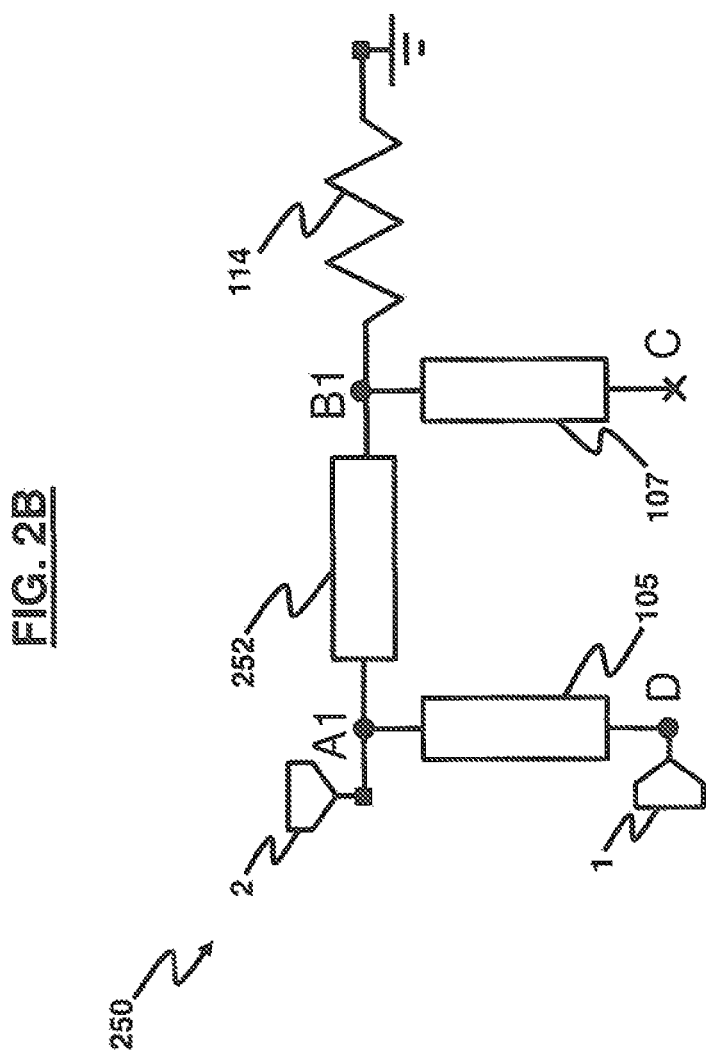
FIG. 2B illustrates a schematic diagram of an even mode equivalent circuit of the combiner/divider according to an embodiment herein.

FIG. 2A, with reference to FIGS. 1A through 1C, is a schematic diagram of a combiner/divider circuit 200 according to an embodiment herein. In an embodiment herein, the combiner/divider circuit 200 may be a coupled-Gysel circuit that replaces the Z2-lines 110 with a single coupled line 210. Replacing the other lines (Z1 105 and Z3 107) with coupled lines increases complexity/loss is possible, however, doing so adds negligible benefits. FIG. 2B, with reference to FIGS. 1A through 2A, is a schematic diagram illustrating the even mode equivalent circuit 250 of the combiner/divider circuit 200 according to an embodiment herein. FIG. 2C, with reference to FIGS. 1A through 2B, is a schematic diagram illustrating an odd mode equivalent circuit 270 of the combiner/divider circuit 200, according to an embodiment herein.

In an embodiment herein, the even mode equivalent circuit 250 includes a Zeven 252. In an embodiment herein, the odd mode equivalent circuit 270 includes a Zodd 272. Since the even mode should see an open circuit to the right of A1 and A2, in an embodiment herein Zeven is chosen to be as large as possible.

The odd mode sees a shorted (at D) λ/4 Z1-fine in parallel with the Zodd 272. Choosing a Zodd 272 equal to 50Ω gives a perfect match to the odd mode at $f_o$, as expected, according to an embodiment herein. Choosing Zodd 272 greater than 50Ω is disadvantageous as it directs more energy towards the Z1-fine. Choosing Zodd 272 less than 50Ω reduces the match at $f_o$ at the expense of a larger bandwidth. Choosing Zodd 272 between 25-50Ω increases the bandwidth while maintaining reasonable isolation (>10-30 dB) across the band.

Figure 3A:
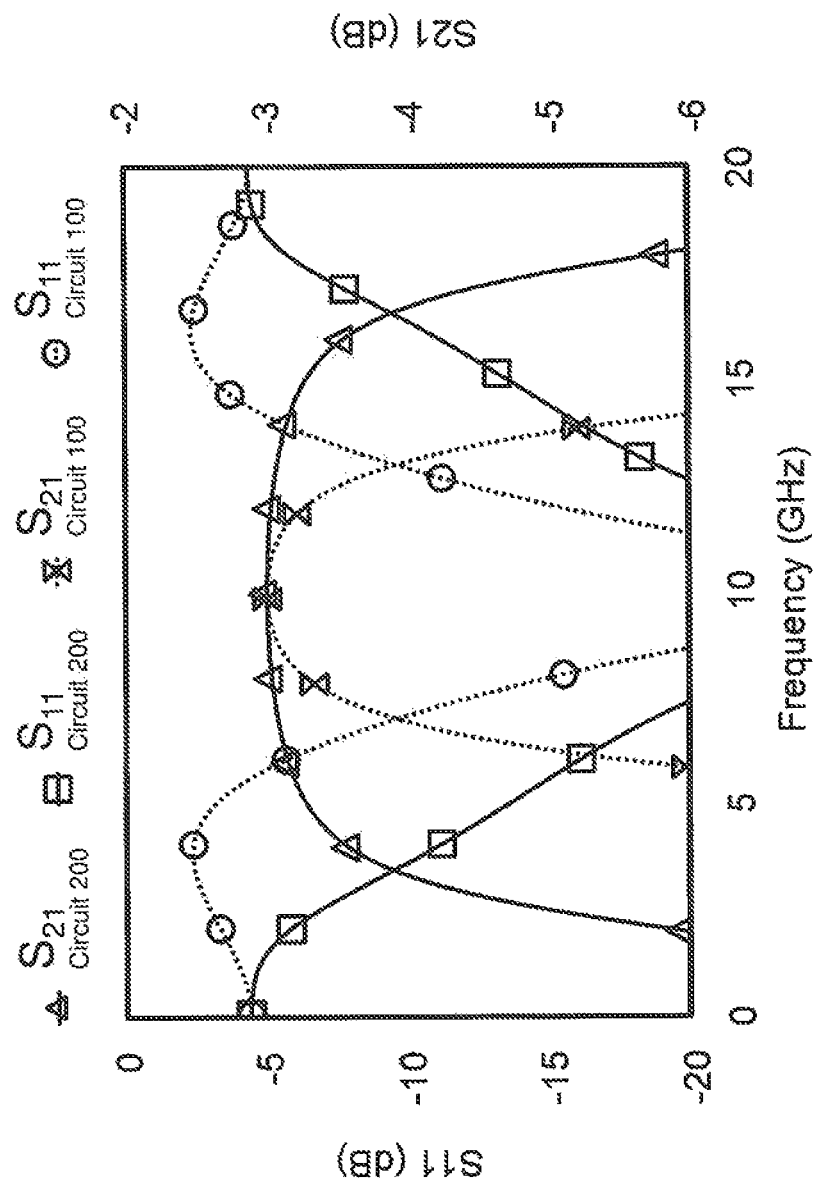
FIG. 3A is a graph illustrating simulation results of scattering parameters $S_{11}$ and $S_{21}$ according to an embodiment herein.
Figure 3B:
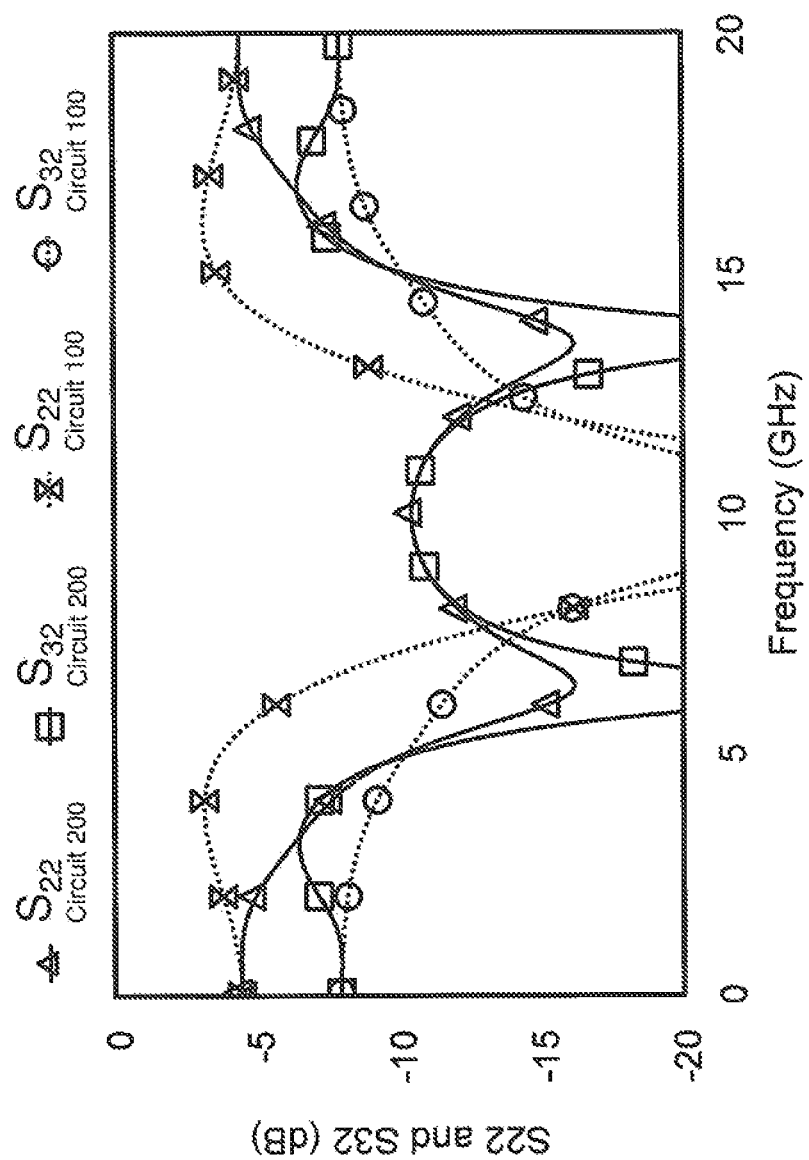
FIG. 3B is a graph illustrating simulation results of scattering parameters $S_{22}$ and $S_{32}$ according to an embodiment herein.

FIGS. 3A and 3B, with reference to FIGS. 1A through 2C, are diagrams illustrating results according to embodiments herein. FIGS. 3A and 3B illustrate the scattering parameter (S-parameter) of the combiner/divider circuits 100 and 200 versus frequency according to an embodiment herein. FIG. 3A illustrates S-parameter $S_{11}$ on the left axis, and $S_{21}$ on the right axis for the combiner/divider circuit 100 (in dotted lines) and for the combiner/divider circuit 200 (in solid lines). FIG. 3B illustrates $S_{22}$ and $S_{32}$, both on the left axis, for the combiner/divider circuit 100 (in dotted lines) and for the combiner/divider circuit 200 (in solid lines).

Assuming a center frequency of 10 GHz, FIGS. 3A, and 3B show a comparison between the combiner/divider circuit 100 and the combiner/divider circuit 200 where Zeven 252=250Ω, and Zodd 272=25Ω were used. If bandwidth is defined as a 1 dB drop in insertion loss, then the combiner/divider circuit 100 covers 7-13 GHz (60% fractional bandwidth), and the combiner/divider circuit 200 covers 3.3-16.7 GHz (133% fractional bandwidth). If bandwidth is defined by a minimum of 10 dB isolation, and input/output insertion loss, then the combiner/divider circuit 100 covers 7.12-12.88 GHz (57% fractional bandwidth), and the combiner/divider circuit 200 covers 4.95-15.05 GHz (101% fractional bandwidth).

The embodiments herein provide implementations and test results of a 2.5-8 GHz combiner/divider circuit and a 3.4-10.2 GHz combiner/divider circuit. FIG. 4, with reference to FIGS. 1A through 3B, is a diagram illustrating the layout of the fabricated 2.5-8 GHz combiner/divider 400 according to an embodiment herein. The fabricated combiner divider 400 may include the ports 1, 2, and 3 (referring to the ports in FIG. 2A), impedance lines 407 (corresponding to the λ/4 Z3-line 107 in FIG. 2A), impedance lines 405 (corresponding to the λ/4 Z1-fine 105 in FIG. 2A), and resistors 414 (corresponding to the resistors 114 in FIG. 2A). In an exemplary embodiment herein, the combiner/divider 400 measures 0.2"×0.6" only. In an embodiment herein, the coupled line 210 is implemented using two narrow microstrip lines 402 with a 3 mil width and a 2.1 mil gap (should support about 300 Watts continuous wave (CW) before air breakdown) and equivalent Zeven 252 and Zodd 272 impedances are Zeven=150Ω, and Zodd=40Ω, respectively. In other embodiments, instead of microstrip lines, the coupled line 210 might include a pair of striplines, co-planar waveguide lines or similar transmission line element(s).

Figure 5:
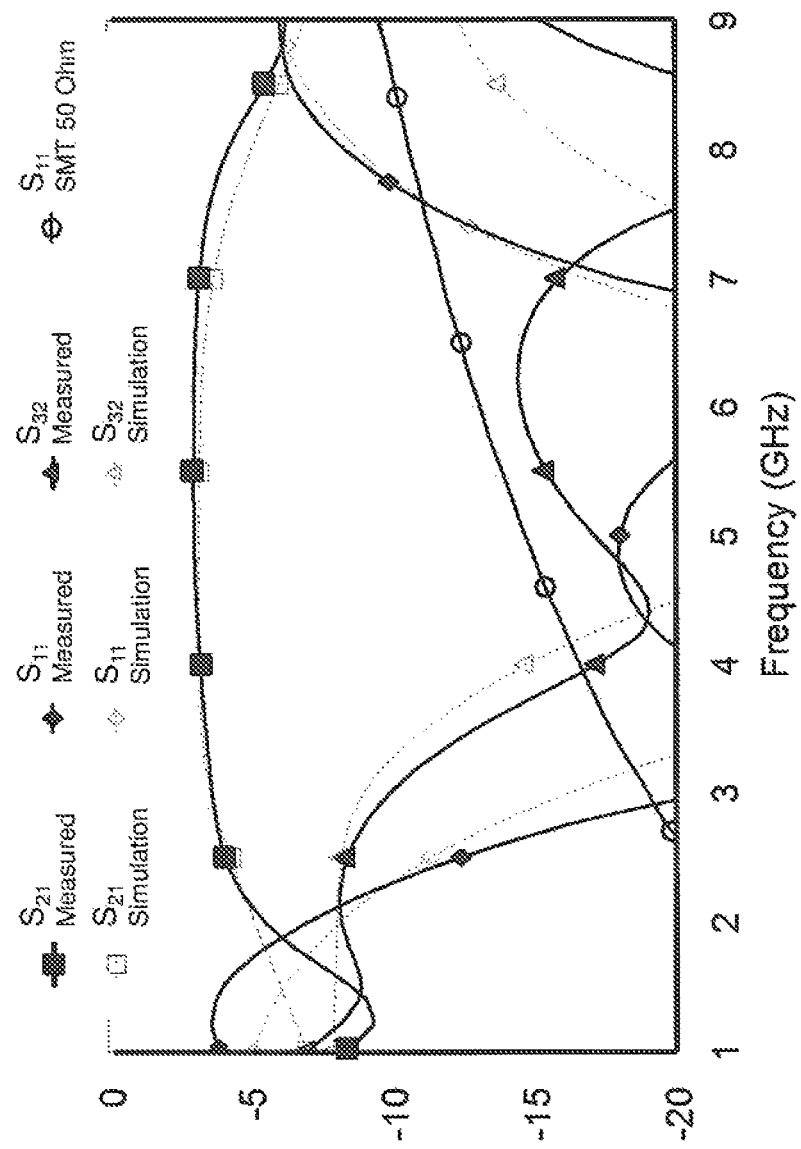
FIG. 5 is a graph illustrating simulation and measured results of scattering parameters according to an embodiment herein.

FIG. 5, with reference to FIG. 1A through 4, is a graph illustrating the measured performance of the combiner/divider 400, along with the simulation results, according to an embodiment herein. The bandwidth based on 1 dB insertion loss is 2.5-8 GHz (105% fractional bandwidth), and the insertion loss in the center of the band is 3.1 dB; hence the divider has 0.1 dB of loss. As illustrated by FIG. 5, close agreement between the simulation and measurement is observed. One of the contributing factors to the differences between the simulation and measurement results is that the surface mount technology (SMT) 50Ω termination resistors perform poorly at high frequency as their S11 (line with circle symbols) shown in FIG. 5.

Figure 6:
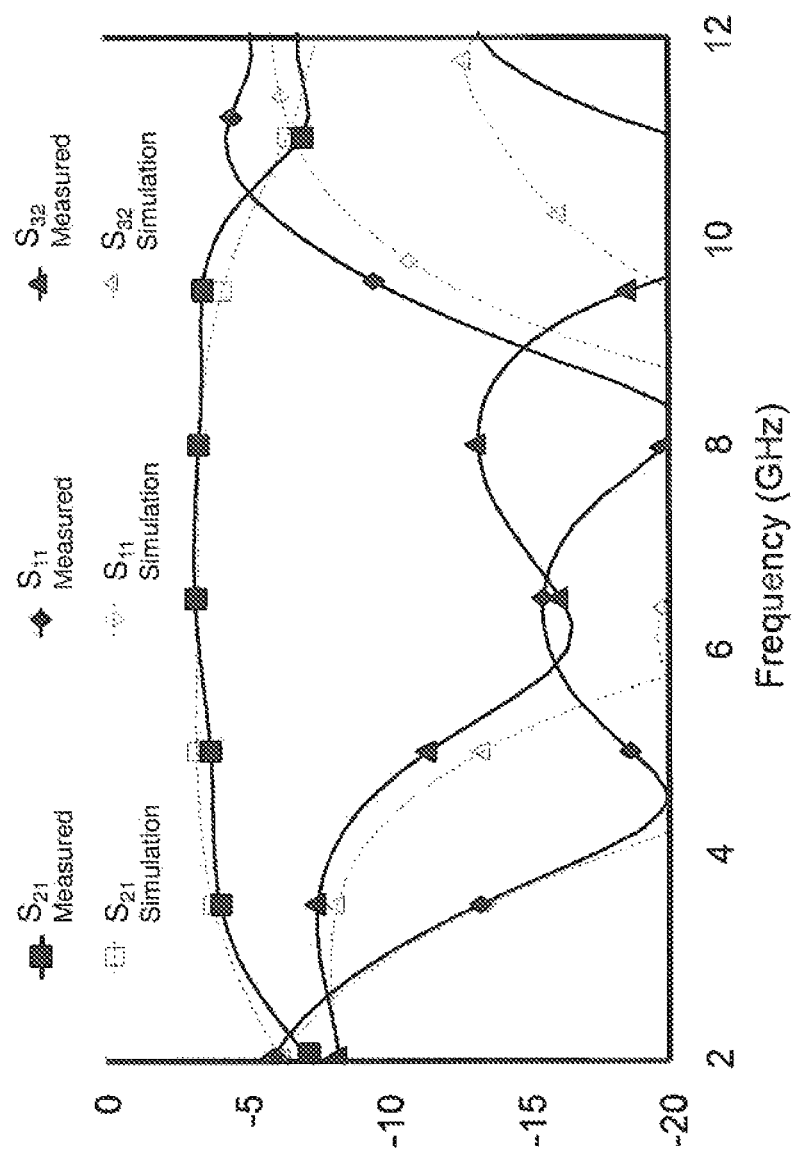
FIG. 6 is a graph illustrating simulation and measured results of scattering parameters according to an embodiment herein.

FIG. 6, with reference to FIGS. 1A through 5, is a graph illustrating the simulation and measurement for a high frequency 3.4-10.2 GHz combiner/divider, according to an embodiment herein. The bandwidth based on the 1 dB insertion loss is 3.4-10.2 GHz (100% fractional bandwidth), and the RF loss in the center of the band is 3.2 dB, where the combiner/divider's loss is 0.2 dB. As illustrated in FIG. 5 and FIG. 6, close agreement between the simulation and measurement is observed. However, an important source to the differences is SMT 50Ω termination resistors.

FIG. 7, with reference to FIGS. 1A through 6, is a flow diagram illustrating a method 700 according to an embodiment herein. The method 700 may include partitioning (702) a combiner and divider circuit 200 into an incident even mode section 250 and a reflection odd mode section 270; and isolating (704) an incident even-mode signal from a reflected odd-mode signal such that the incident even-mode signal travels in a different path from the reflected odd-mode signal.

The techniques provided by the embodiments herein may be implemented on next generation radar and communication systems, where multiple systems of different frequencies can be implemented with one output transmitter. The embodiments herein may also be used in electronic warfare (EW) applications, where broadband high power signals are required, and high power agile jamming radars where high amplifiers are combined. They can also be implemented on wireless commercial communications (5 G or faster), and under adverse conditions.

The embodiments herein can provide a modified coupled-Gysel combiner/divider circuit exhibiting very broadband performance and low loss due to its simplicity and flexibility. Other embodiments may similarly provide a modified coupled-Wilkinson combiner/divider as the construction and operation of the Gysel combiner/divider circuit are similar to a Wilkinson combiner/divider circuit. The embodiments herein provide a 2.5-8 GHz (105% fractional bandwidth) divider, and a 3.4-10.2 GHz (100% fractional bandwidth). The embodiments herein provide compact size for a combiner/divider that makes it suitable for MMIC implementation. MMIC implementations show improved performance as a greater range of Zeven and Zodd impedances and more precise terminating resistors can be realized.

The embodiments herein provide a new architecture that enables the realization of single transmitter for multifrequency radar systems, and very broadband EW systems. Power combining of high power amplifiers at microwave frequencies is challenging because achieving broadband isolation is difficult. Conventional approaches (e.g., Wilkinson combiner, rat-race combiner, and Lange coupler combiner) have limited bandwidth and/or low power handling capability. The embodiments herein provide a combiner/divider that can handle high power and support very broadband operation. A basic premise in embodiments herein relies on incorporating transmission lines that can behave differently for the odd/even mode, such that reflected signals (odd mode) can travel in a different path from incident signals (even mode). This enables the absorption of the reflected odd-mode signals over a broadband in grounded isolation resistors. The isolation resistors are not assumed to be electrically small herein. Hence, large, high-power resistors can be employed without performance degradation.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A power combiner and divider device, said device comprising:
   a first port electrically connected to a first impedance line and a second impedance line;
   a second port electrically connected to said first impedance line and a coupled line;
   a third port electrically connected to said second impedance line and said coupled line;
   a third impedance line electrically connected to said coupled line; and
   a fourth impedance line electrically connected to each of said third impedance line and said coupled line.

2. The device of claim 1, wherein said third impedance line is electrically connected to a first resistor at a first connection point where said third impedance line is electrically connected to said coupled line, and wherein said first resistor is electrically connected to ground.

3. The device of claim 2, wherein said fourth impedance line is electrically connected to a second resistor at a second connection point where said fourth impedance line is electrically connected to said coupled line, and wherein said second resistor is electrically connected to ground.

4. The device of claim 3, wherein said first resistor is approximately 50 ohms and said second resistor is approximately 50 ohms.

5. The device of claim 4, wherein an even mode equivalent impedance from said second port and said third port is adjusted independent from an odd mode equivalent impedance from said second port and said third port by adjusting a coupling ratio of said coupled line.

6. The device of claim 5, wherein said even mode equivalent impedance is greater than said odd mode equivalent impedance.

7. The device of claim 1, wherein said first port is configured to be a first input and the second and third ports are configured to be a first plurality of outputs when said device is used as a divider, and wherein the second and third ports are configured to be a second plurality of inputs, and said first port is configured to be a second output when said device is used as a combiner.

8. The device of claim 1, wherein said coupled line comprises:
   a first microstrip line having a first width; and a second microstrip line having a second width,
wherein said first width is approximately equal to said second width, and
wherein said first microstrip is in parallel with said second microstrip.

9. The device of claim 1, configured to operate in a frequency range from a lower frequency to a higher frequency, wherein said higher frequency is approximately four times higher than said lower frequency.

10. A method comprising:
partitioning a combiner and divider circuit into an incident even mode section and a reflection odd mode section; and
isolating an incident even-mode signal from a reflected odd-mode signal such that said incident even-mode signal travels in a different path from said reflected odd-mode signal, wherein said reflected signal is generated by an impedance mismatch of an electronic joint in said circuit,
wherein said circuit is configured to operate in a frequency range from a lower frequency to a higher frequency, wherein said higher frequency is approximately four times higher than said lower frequency.

11. The method of claim 10, further comprising:
electrically connecting a first port to a first impedance line and a second impedance line;
electrically connecting a second port to said first impedance line and a coupled line;
electrically connecting a third port to said second impedance line and said coupled line;
electrically connecting a third impedance line to said coupled; and
electrically connecting a fourth impedance line to each of said third impedance line and said coupled line.

12. The method of claim 11, further comprising:
electrically connecting said third impedance line to a first resistor at a first connection point where said third impedance line is electrically connected to said coupled line; and
electrically connecting said first resistor to ground.

13. The method of claim 12, further comprising:
electrically connecting said fourth impedance line to a second resistor at a second connection point where said fourth impedance line is electrically connected to said coupled line; and
electrically connecting said second resistor to ground.

14. The method of claim 13, wherein said first resistor is approximately 50 ohms and said second resistor is approximately 50 ohms.

15. The method of claim 14, further comprising adjusting a coupling ratio of said coupled line to adjust an even mode equivalent impedance from said second port and said third port independently from an odd mode equivalent impedance from said second port and said third port.

16. The method of claim 15, further comprising adjusting said even mode equivalent impedance to be greater than odd mode equivalent impedance.

17. The system of claim 16, further comprising adjusting said odd mode equivalent impedance to be approximately 50 ohms.

18. A power combiner and divider device, said device comprising:
a first port electrically connected to a first impedance line and a second impedance line;
a second port electrically connected to said first impedance line and a coupled line;
a third port electrically connected to said second impedance line and said coupled line;
a third impedance line electrically connected to said coupled line; and
a fourth impedance line electrically connected to each of said third impedance line and said coupled line,
wherein said third impedance line is electrically connected to a first resistor at a first connection point where said third impedance line is electrically connected to said coupled line, and said first resistor is electrically connected to ground, and
wherein said fourth impedance line is electrically connected to a second resistor at a second connection point where said fourth impedance line is electrically connected to said coupled line, and said second resistor is electrically connected to ground.

19. The device of claim 18, wherein said first resistor is approximately 50 ohms and said second resistor is approximately 50 ohms, and wherein an even mode equivalent impedance from said second port and said third port is adjusted independent from an odd mode equivalent impedance from said second port and said third port by adjusting a coupling ratio of said coupled line.

20. The device of claim 19, wherein said even mode equivalent impedance is greater than odd mode equivalent impedance, and wherein said odd mode equivalent impedance is approximately 50 ohms.

* * * * *